US007554357B2

(12) United States Patent
Chen et al.

(10) Patent No.: US 7,554,357 B2
(45) Date of Patent: Jun. 30, 2009

(54) EFFICIENT CONFIGURATION OF DAISY-CHAINED PROGRAMMABLE LOGIC DEVICES

(75) Inventors: Zheng (Jeff) Chen, Allentown, PA (US); Barry Britton, Orefield, PA (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 258 days.

(21) Appl. No.: 11/346,817

(22) Filed: Feb. 3, 2006

(65) Prior Publication Data

US 2007/0182445 A1    Aug. 9, 2007

(51) Int. Cl.
*H03K 19/173* (2006.01)
(52) U.S. Cl. .......................................... 326/39; 326/47
(58) Field of Classification Search ............. 326/37–41, 326/47, 101
See application file for complete search history.

(56) References Cited

U.S. PATENT DOCUMENTS

| | | | |
|---|---|---|---|
| 5,563,592 A | 10/1996 | Cliff et al. | |
| 5,754,734 A | 5/1998 | Emeott et al. | |
| 5,768,372 A | 6/1998 | Sung et al. | |
| 5,794,033 A | 8/1998 | Aldebert | |
| 5,872,529 A | 2/1999 | Mejia | |
| 6,028,445 A | 2/2000 | Lawman | |
| 6,038,185 A | 3/2000 | Ng | |
| 6,044,025 A | 3/2000 | Lawman | |
| 6,327,634 B1 | 12/2001 | Statovici | |
| 6,483,342 B2 | 11/2002 | Britton et al. | |
| 6,493,862 B1 | 12/2002 | Young et al. | |
| 6,507,214 B1 | 1/2003 | Snyder | |
| 6,507,943 B1 | 1/2003 | Kelem | |
| 6,525,678 B1 | 2/2003 | Veenstra et al. | |
| 6,563,437 B1 | 5/2003 | Landry et al. | |
| 6,564,285 B1 | 5/2003 | Mills | |
| 6,744,388 B1 | 6/2004 | Khu | |
| 6,772,230 B2 | 8/2004 | Chen et al. | |
| 6,785,165 B2 | 8/2004 | Kawahara | |
| 6,885,227 B2 | 4/2005 | Agrawal et al. | |
| 6,903,574 B2 | 6/2005 | Chen et al. | |
| 7,019,577 B2 | 3/2006 | Agrawal et al. | |
| 7,034,599 B1 | 4/2006 | Agrawal et al. | |
| 7,062,615 B2 * | 6/2006 | Miller et al. | 711/152 |
| 7,088,131 B1 * | 8/2006 | Stout et al. | 326/33 |
| 7,242,221 B1 * | 7/2007 | Hoang et al. | 326/82 |
| 2004/0061147 A1 | 4/2004 | Fujita | |
| 2004/0064622 A1 | 4/2004 | Smith | |
| 2006/0143366 A1 * | 6/2006 | Yang et al. | 711/103 |

OTHER PUBLICATIONS

U.S. Appl. No. 10/809,658, Tang.
U.S. Appl. No. 11/243,255, filed Oct. 2005, Tang.
AT17LV(A) Series FPGA Configuration Memory, Ref. 0437K-CNFG-May 2003, pp. 1-18, ATMEL Corporation.
FPGA Configuration EEPROM Memory, 2322F-CNFG, Jun. 2005, pp. 1-18, ATMEL Corporation.
Configuring Cyclone II Devices, Cyclone Device Handbook, Jul. 2005, vol. 1, Chapters 13-14, Altera Corporation.
U.S. Appl. No. 11/494,862, filed Jul. 28, 2006, Booth et al.
U.S. Appl. No. 11/530,620, filed Sep. 11, 2006, Callahan et al.

* cited by examiner

*Primary Examiner*—Rexford N Barnie
*Assistant Examiner*—Thienvu V Tran
(74) *Attorney, Agent, or Firm*—Haynes and Boone, LLP

(57) ABSTRACT

In one embodiment, a programmable logic device includes: a multiplexer adapted to select a compressed configuration bitstream from a plurality of external serial interface memories; a serial interface processor adapted to command the bitstream selection by the multiplexer; and a bitstream decompressor adapted to decompress the selected configuration bitstream into a decompressed configuration bitstream.

18 Claims, 3 Drawing Sheets

EFFICIENT CONFIGURATION OF DAISY-CHAINED PROGRAMMABLE LOGIC DEVICES

TECHNICAL FIELD

The present invention relates generally to semiconductor devices and, more particularly, to the configuration of daisy-chained programmable logic devices.

BACKGROUND

Data storage devices and memories may be classified into two types: volatile and non-volatile. Whereas power must be provided to a volatile memory to maintain its stored information, a non-volatile memory may be powered down yet still retain the stored information. Examples of non-volatile memory include Electrically Erasable Programmable Read Only Memory (EEPROM) and flash. Static Random Access Memory (SRAM) is a conventional example of a volatile memory.

Both volatile and non-volatile memories may be used to store the configuration data for programmable logic devices. Traditionally, a type of programmable logic device known as a Complex Programmable Logic Device (CPLD) has stored its configuration data in a non-volatile memory such as EEPROM. In contrast to CPLDs, another type of programmable logic device known as a Field Programmable Gate Array (FPGA) typically stores its configuration data in an SRAM. Such SRAM-based FPGAs must thus be reconfigured upon power-up from an external non-volatile memory (often denoted as a boot memory). However, SRAM-based FPGAs are typically capable of handling complex logic designs more efficiently than CPLDs and have thus become dominant in the programmable logic device market.

As SRAM-based FPGAs continue to grow in complexity, the corresponding amount of SRAM needed to store the configuration data must grow as well. A conventional external non-volatile memory used to boot the configuration data into an SRAM-based FPGA is a Programmable Read Only Memory (PROM). However, the rise in popularity in devices such as digital cameras has caused flash memory to become cheaper and also faster in comparison to traditional PROMs. Thus, FPGAs have been developed to use flash as their external configuration memories. To further reduce costs, flash memories are now available that use the low-cost Serial Peripheral Interface (SPI) standard, an interface standard specified by Motorola Corporation of Schaumburg, Ill. Conventional FPGAs using SPI flash as their external configuration memories are limited, however, to downloading their configuration bit stream from just a single SPI flash.

Accordingly, there is need in the art for programmable logic devices supporting improved SPI flash configuration modes.

SUMMARY

In accordance with an embodiment of the invention, a programmable logic device is provided that includes: a multiplexer adapted to select a compressed configuration bitstream from a plurality of external serial interface memories; a serial interface processor adapted to command the bitstream selection by the multiplexer; and a bitstream decompressor adapted to decompress the selected configuration bitstream into a decompressed configuration bitstream.

In accordance with another aspect of the invention, a method of configuring at least one programmable logic device (PLD) is provided that includes the acts of: receiving a signal indicating a number of serial interface memories coupled to the at least one PLD; gating a PLD read clock according to the number to provide a serial read clock to the serial interface memories; and receiving a compressed configuration bitstream from each of the number of serial interface memories in response to the serial read clock.

In accordance with another aspect of the invention, a programmable logic device is provided that includes: a memory interface adapted to receive a first address signal from an external source; configuration memory cells adapted to store a second address signal; and an SPI processor adapted to select either the first address signal or the second address signal and to provide the selected address as a leading read address to at least one SPI flash memory.

In accordance with another aspect of the invention, a system is provided that includes: a plurality of serial interface memory devices, each adapted to store a configuration bitstream; a master field programmable gate array (FPGA) coupled to the plurality of serial interface memories to receive their bistreams, the master PLD including: a multiplexer adapted to select the configuration bitstream from each of the plurality serial interface memories; and a serial interface processor adapted to command the bitstream selection by the multiplexer; and one or more slave FPGAs daisy chained to the master FPGA and adapted to receive a configuration bitstream from the master FPGA.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
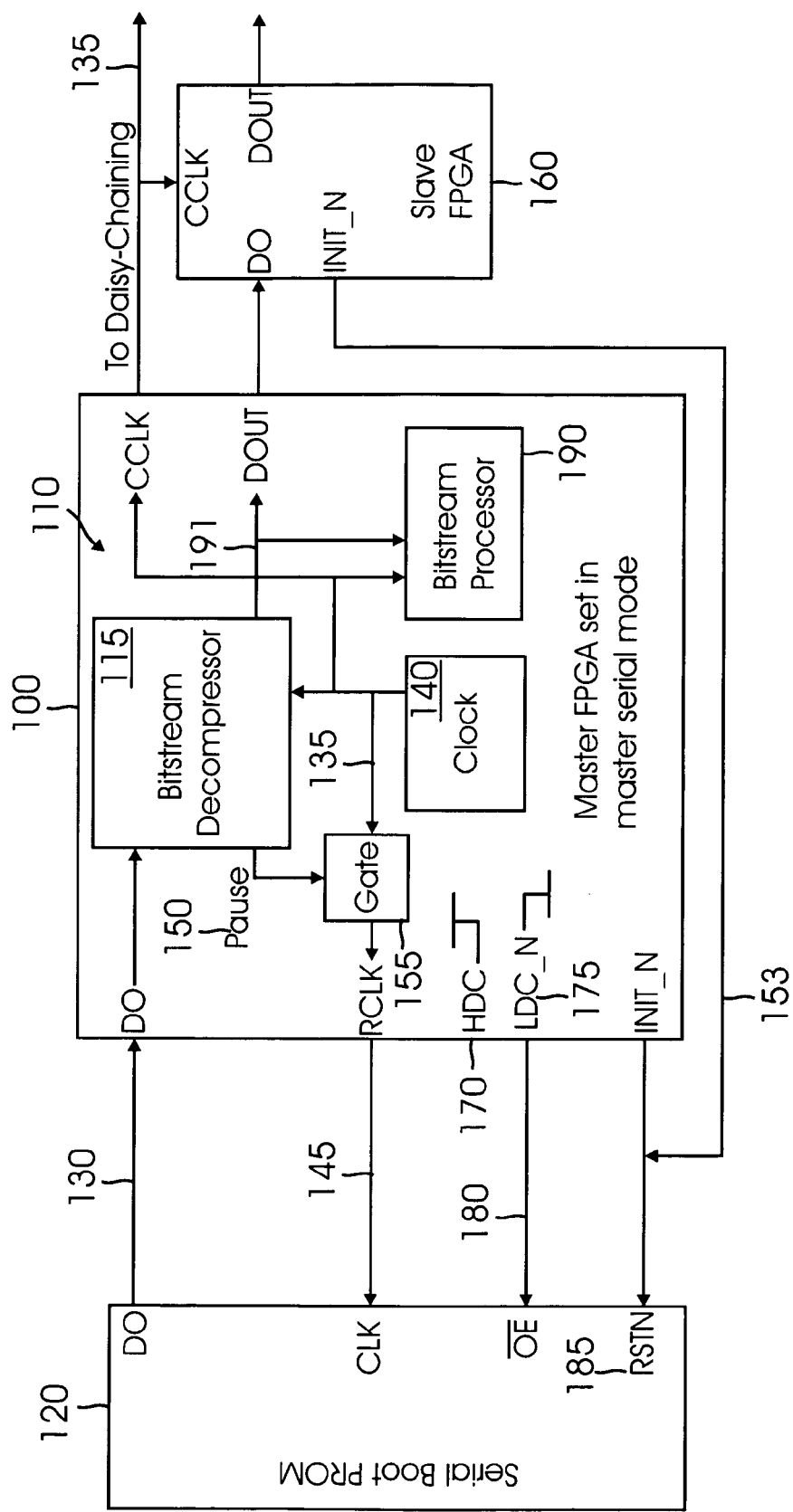
FIG. 1 is a block diagram of a master FPGA configured to decompress a compressed configuration bitstream from a PROM and provide a decompressed configuration bitstream to optional daisy-chained slave FPGAs in accordance with an embodiment of the invention.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

The flash configuration modes for a programmable logic device (PLD) described herein may be practiced with or without configuration bitstream compression. Because bitstream compression reduces the required external configuration memory size, a bitstream compression embodiment will be described initially. Any suitable compression scheme may be used such as, for example, the Lempel-Ziv-Welch (LZW) algorithm.

The implemented compression scheme is typically independent of the configuration bitstream format. An exemplary bitstream format is described in co-assigned U.S. Pat. No. 6,483,342, which is incorporated by reference in its entirety. In this exemplary configuration bitstream format, the configuration bitstream begins with a header or preamble frame that may identify the size of the configuration bitstream (such as a 24-bit or a 32-bit address count bitstream). An ID frame follows the header frame and identifies the type of device that the bitstream is intended for. The address and data frames then follow the ID frame. Finally, the bitstream ends with a postamble frame. Thus, in such embodiments, the header and ID frames are not compressed but the subsequent codewords are compressed.

The compression scheme being implemented may be an adaptive one in which the configuration bitstream is analyzed to identify, for example, those one-byte codewords that are used more prevalently. The following table describes a header and ID frame format that reserves 40 bits in the ID frame to identify five of these "varying-from-design-to-design" one-byte codewords:

| Frame type | codeword | definition |
| --- | --- | --- |
| Header | 11110010 or 11101000 | Preamble in the header that identifies the bitstream length (24 bit or 32 bit, respectively) |
|  | 11111111 | one byte trailing header |
| Frame ID | 0101 1111 1111 1111 | identifies start of frame ID |
|  | 40 reserved bits | identifies five codewords based upon their prevalence in the configuration bitstream |
|  | 1-bit compression code | one-bit flag identifying whether the following address and data frames are compressed |
|  | 3-bit speed code | speed choices for internal clock |
|  | 20-bit Part ID | identifies the type of device to be configured |
|  | 8-bit checksum | error correction |
|  | 1111 1111 | indicates end of frame |

Although described within the context of the preceding header and frame ID bitstream format, it will be appreciated that the header frames for other bitstream formats may be adapted to perform the same functions A master serial configuration mode for daisy-chained programmable logic devices such as FPGAs that includes configuration logic configured to decompress a compressed configuration bitstream is illustrated in FIG. 1. A master EPGA 100 includes a configuration logic engine 110. Master FPGA 100 controls the configuration of one or more daisy-chained slave FPGAs such as a slave FPOA 160 in a conventional master/slave fashion. As also known in the art, a configuration logic engine such as engine 110 may be "hardwired" so that it is up and running prior to configuration of the master FPGA. Alternatively, configuration logic engine 110 may be implemented by appropriate configuration of logic resources. To implement a decompression scheme, the configuration logic engine includes a bitstream decompressed 115 having the logic necessary to decompress compressed configuration codewords received from an external memory such as a serial boot PROM device 120 as a data out (DO) signal 130. Thus, the bitstream decompressor has the logic to recognize the end of the ID frame and whether compression has been used. Because the bitstream decompressor identifies whether compression has been used directly from the DO signal (such as from the ID frame), no external pin need be dedicated in the master FPGA to a compression flag signal. The bitstream decompressor includes the logic to map the compressed codewords following the end of the ID frame into the corresponding decompressed codewords. In addition, the bitstream decompressor may control the rate of the incoming codewords from the PROM. The bitstream decompressor is clocked by an internal clock signal 135 from a clock 140. Should there be no compression being implemented, the internal clock is sent unchanged as a read clock (RCLK) 145 that clocks the serial output of the configuration data DO from the PROM. However, should bitstream decompressor 115 have to decompress codewords in the DO signal, the internal clock rate may be too fast to allow for the required decompression processing. Thus, the bitstream decompressor may assert a pause signal 150 to prevent the clocking of the PROM by the read clock RCLK. For example, the pause signal may drive a gate circuit 155 that gates the internal clock from driving the read clock RCLK. If the pause signal is not asserted, then the gate circuit simply allows the internal clock to pass through as the read clock RCLK. The serial DO signal may be read from the PROM at a given edge of the read clock such as the rising edge. As known in the art, an initialization signal (INIT_N) 153 may be asserted by the master and slave FPGAs when these devices are ready to receive their configuration bitstreams. In such an embodiment, the PROM may respond to the initialization signal as an active low reset (RSTN) signal 185. Either a high-during-configuration (HBC) signal 170 or a low-during-configuration signal (LDC_N) 175 may be used as a chip select or an output enable (OE) signal 180 for the PROM.

Having decompressed the compressed codewords, the bitstream decompressor provides a serial output signal (DOUT) 191 (the decompressed configuration bitstream) to a bitstream processor 190. As known in the art, processor 190 controls the shifting of the configuration bitstream into the configuration memory (not illustrated) of the master FPGA. After the master has been configured, the decompressed bitstream is provided to slave FPGA 160, which includes a configuration logic engine (not illustrated) that controls its configuration in the conventional fashion. After its configuration, slave FPGA 160 may then couple the decompressed bitstream to additional downstream daisy-chained slave devices (not illustrated) and so on.

Figure 2:
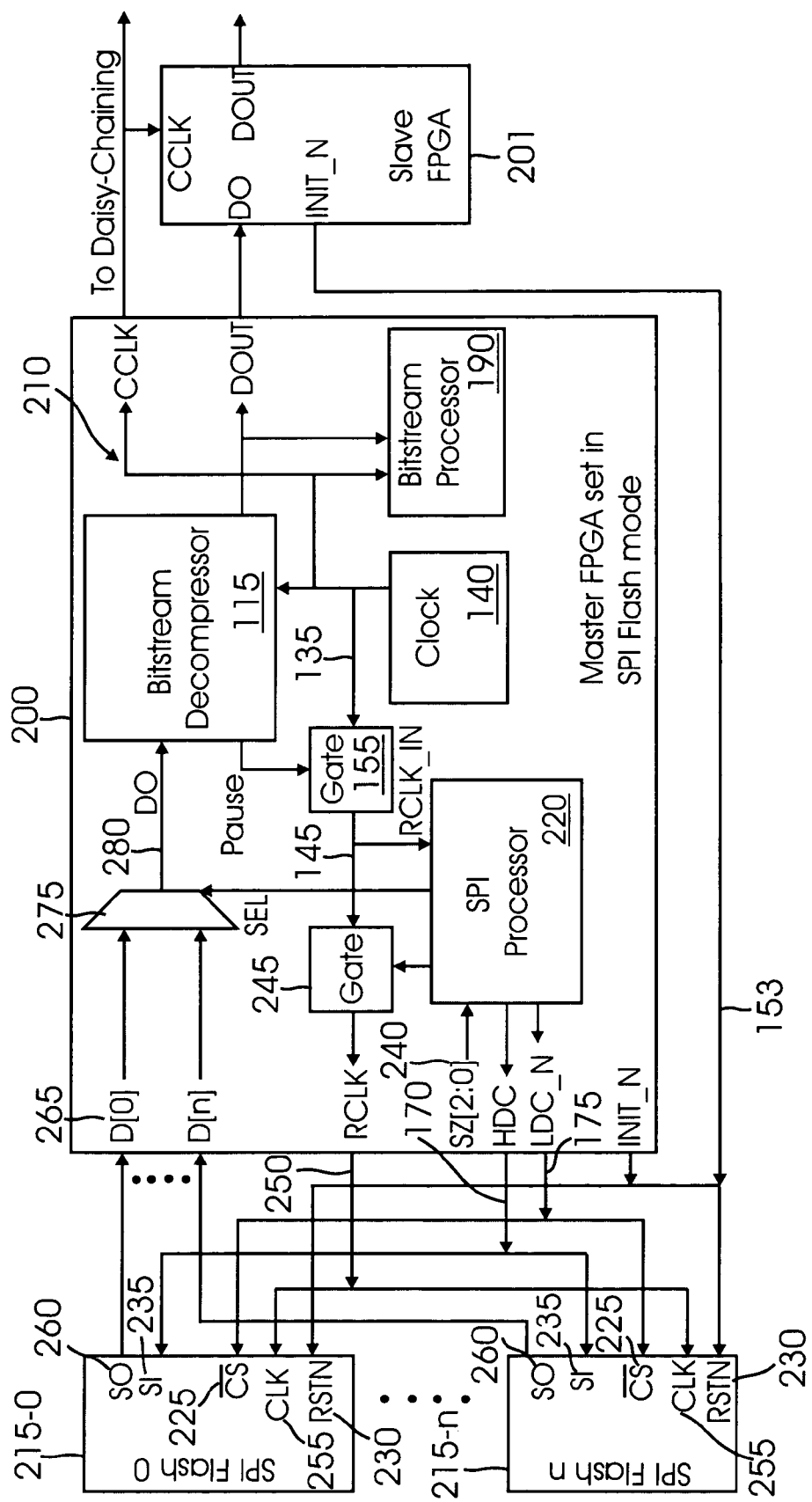
FIG. 2 is a block diagram of a master FPGA configured to decompress a compressed configuration bitstream from a plurality of SPI flash memories and provide a decompressed bitstream to optional daisy-chained slave FPGAs in accordance with an embodiment of the invention.

The master FPGA 100 may advantageously be modified to include a serial interface processor that allows the configuration bitstream (whether compressed or uncompressed) to be downloaded from one or more serial interface memories such as serial peripheral interface (SPI) flash memories. Because SPI flash memory can be substantially less expensive than conventional (and often proprietary) PROMs, substantial savings can be achieved through this modification. Turning now to FIG. 2, a master FPGA 200 includes a configuration logic engine 210 adapted to download a configuration bitstream from a plurality of SPI flash memory devices 215, ranging from an SPI flash 215-0 to an SPI flash 215-n. The master FPGA may includes a bitstream decompressor 115 and a bitstream processor 190 that provides a decompressed configuration bitstream to daisy-chained slave FPGAs such as slave FPGA 201.

The master FPGA includes an SPI processor 220 that generates the necessary SPI control signals. For example, the SPI processor may be adapted to use low-during-configuration (LDC_N) signal 175 to drive the SPI flash memories' active-low chip-select ($\overline{CS}$) inputs 225. LDC_N signal 175 is low during configuration except for a short high pulse following INIT_N 153 being asserted to drive a reset (RSTN) input 230 for the SPI flash memories. In addition, the SPI processor may be adapted to send read command and leading read address signals to the SPI flash memories by using high-during-configuration (HDC) signal 170 to drive a serial input (SI) 235 for the SPI flash memories. These commands may be communicated using the HDC signal after the short high pulse of the LDC_N signal.

The number of flash memories from which the master FPGA receives its configuration bitstream is a variable that may be controlled by a three-bit input signal SZ(2:0) 240. The SZ input pins (not illustrated) may be shared with other configuration modes or simply be dedicated to the SPI configuration process. Because the input signal SZ is a three-bit signal, the maximum number of SPI flash memories it may designate is eight. However, it will be appreciated that by increasing the bit size for the SZ signal, additional SPI memories may be designated. Regardless of the number of SPI flash memories providing configuration data, the resulting configuration bitstream may be compressed. Thus, the configuration logic engine includes gate 155 that provides a gated read clock 145 as discussed previously. However, depending upon the number of SPI flash memories (as designated by the SZ signal), the SPI processor further gates the read clock using a gate circuit 245 to provide a read clock (RCLK) 250 that drives a clock input (CLK) 255 for each of the SPI flash memories. If, for example, there are seven SPI flash memories, then the SPI processor would drive gate circuit 245 so that RCLK 250 would cycle just once for every seven cycles of read clock 145.

The value of the SZ input signal may be latched during the short high pulse of the LDC_N signal in a latch (not illustrated). Regardless of the number of SPI flash memories that will provide configuration bitstream data to the master FPGA, each SPI flash memory will require a read command and a leading read address as practiced under the SPI protocol. In one embodiment, this command and address are transmitted over the HDC signal as the serial input signal to the SPI flash memories as discussed previously. After the short high pulse on the LDC_N signal, the SPI read clock is toggled for a number of continuous clock cycles, such as, for instance, 128 cycles. The SPI read command (which is conventionally represented as 00000011) may be transmitted over the SI signal in the first eight of the SPI read clock cycles. As determined by the SPI flash memory size, the SPI leading read address may be transmitted over the SI signal in the following 24 to 34 cycles of the SPI read clock. After the transmission of the leading read address, the HDC/SI signal becomes don't-care to the SPI flash memories.

Depending upon the number of SPI flash memories indicated by the SZ input signal, the SPI processor gates read clock 145 in a gating circuit 245 to form SPI read clock 250. For example, if there are seven of the SPI flash memories, there is one cycle of the SPI read clock for every seven cycles of read clock 145. In general, if there are an integer number n of the SPI flash memories, there is one cycle of the SPI read clock for every n cycles of read clock 145.

The configuration bitstream data may be transmitted over a serial output (SO) signal 260 for each of the SPI flash memories. The master FPGA may receive the configuration bitstream data in a D[0:n] input signal 265. Each SO signal is connected to a corresponding bit path of input signal 265. For example, the SO signal from SPI 215-0 may be connected to D[0], and so on such that the SO signal from SPI 215-n may be connected to a D[n]. In that regard, should there be just a single SPI flash memory, its SO signal may be connected to D[0]. Should there be just two SPI flash memories, their SO signals may be connected to D[0] and D[1], and so on. After the pre-defined number of initial cycles of the SPI read clock such as the 128 cycles described previously, the SPI processor controls a multiplexer 275 to select from the D[0:n] signal to provide a data out signal 280 at each cycle of read clock 145 to bitstream decompressor 115. Individual ones of the D[0:n] signal may be selected in an alternating fashion depending upon the number of SPI flash memories. For example, if there are three SPI flash memories, the selection pattern may proceed as: D[0], D[1], D[2], D[0], D[1], D[2], D[1], and so on. The configuration bitstream data is thus stored in the SPI flash memories in a corresponding interleaved fashion. However, the contents of the SPI flash memories may be don't-care in the first 128 bits following the leading read address to offset for the initial cycles of the SPI read clock during which the SPI read command and the leading read address are transmitted.

Figure 3:
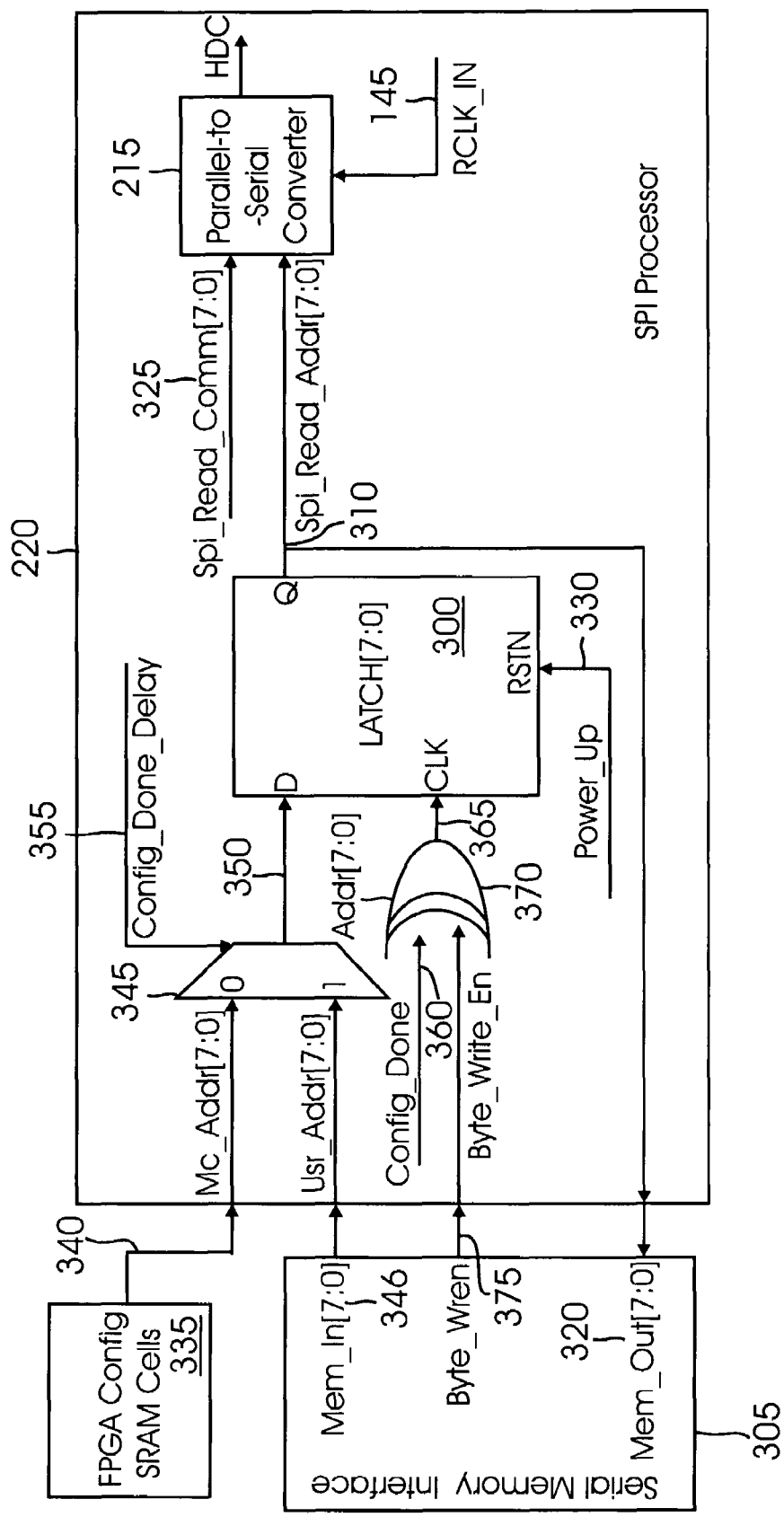
FIG. 3 illustrates a serial memory interface architecture for accessing a latch within the SPI processor of FIG. 2 to change the leading read address according to an embodiment of the invention.

Advantageously, the leading read address transmitted by the master FPGA to the SPI flash memories may be stored within a memory that may be subsequently written to or modified by user operation. For example, U.S. Pat. Nos. 6,483,342 and 6,903,574, the contents of both of which are incorporated by reference, disclose various architectures enabling a user to write to configuration memory cells subsequent to configuration of a programmable logic device. If the master FPGA is thus enabled in this fashion so that the value of the leading read address may be modified after configuration of the master FPGA (and any slave FPGAs 201), multiple configuration bitstream images may be stored in the SPI flash memories. The FPGAs could then be configured in a first configuration, and subsequent to some user-defined event, reconfigured into a second configuration, and so on. Turning now to FIG. 3, a latch 300 for storing the leading read address may be written to using a serial memory interface 305 as disclosed, for example, in U.S. Pat. No. 6,903,574. Latch 300 provides an SPI read address byte 310 to both a parallel-to-serial converter 315 and as a memory output [Mem_Out] signal 320 to serial memory interface 305. The parallel-to-serial converter can serialize byte 310 into the HDC signal responsive to cycles of read clock 145. In addition, the parallel-to-serial converter can serialize an SPI read command byte 325 into the read command portion of the HDC signal.

In one embodiment, latch 300 is reset responsive to a power_up signal 330 such that the leading read address is zero for the initial configuration of the master and slave FPGAs.

After the initial configuration is completed, configuration SRAM cells 335 may provide a byte address signal 340 selected by a multiplexer 345 to provide an address byte 350 latched by the latch. Alternatively, multiplexer 345 may be controlled to select for a memory input signal (Mem_In[7:0]) 346 provided by the serial memory interface. In this fashion, the address byte latched may be provided by an external source coupled to the serial memory interface. Alternatively, the address byte may be provided by internal SRAM configuration memory cells 335.

The selection by multiplexer 345 may be controlled by a configuration done delay (Config_Done_Delay) signal 355 that is asserted after initial configuration subsequent to the assertion of a configuration done (Config_Done) signal 360. The latch is clocked by a clock 365 provided by an XOR gate 370 that receives both the Config_Done signal and a byte write enable (Byte_Write_En) signal 375 from the serial memory interface. Thus, when the Config_Done signal is asserted prior to the assertion of the Config_Done_Delay signal, the latch will latch the SRAM-provided byte address signal 340. During subsequent normal operation in which Config_Done_Delay is now asserted, a user may write new content to the latch through the serial memory interface by asserting the Byte_Write_En signal.

Embodiments described above illustrate but do not limit the invention. For example, it will be appreciated that other implementations are also contemplated by the present disclosure. It should also be understood that numerous modifications and variations are possible in accordance with the principles of the present invention. Moreover, no limitations from the specification are intended to be read into any claims unless those limitations are expressly included in the claims. Accordingly, the scope of the invention is defined by the following claims.

We claim:

1. A programmable logic device, comprising:
a multiplexer adapted to select a compressed configuration bitstream from a plurality of external serial interface memories;
a serial interface processor adapted to command the bitstream selection by the multiplexer;
a latch adapted to store at least a portion of a leading read address signal provided by the serial interface processor to the plurality of serial interface memories; and
a bitstream decompressor adapted to decompress the selected configuration bitstream into a decompressed configuration bitstream.

2. The programmable logic device of claim 1, wherein the programmable logic device is a master field programmable logic device (FPGA) adapted to provide the decompressed configuration bitstream to at least one daisy-chained slave FPGA.

3. The programmable logic device of claim 1, wherein the plurality of serial interface memories are serial peripheral interface (SPI) flash memories and the serial interface processor is an SPI processor.

4. The programmable logic device of claim 3, further comprising:
an interface for receiving a size command indicating the number of SPI flash memories within the plurality, and wherein the SPI processor is further adapted to gate a read clock responsive to the size command.

5. The programmable logic device of claim 1 further comprising:
a memory interface adapted to receive a first address signal from an external source and couple the first address signal to the latch such that the latch may store the first address signal as the at least a portion of the leading read address signal.

6. The programmable logic device of claim 5, further comprising:
a configuration memory, wherein the latch is further adapted to store a second address signal stored by the configuration memory as the at least a portion of the leading read address signal.

7. A programmable logic device, comprising:
a memory interface adapted to receive a first address signal from an external source;
configuration memory cells adapted to store a second address signal;
an SPI processor adapted to select either the first address signal or the second address signal and to provide the selected address as a leading read address to a plurality of SPI flash memories; and
a multiplexer adapted to select from a serial output signal from each of the SPI flash memories to provide a configuration bitstream input signal, the SPI processor being further adapted to command the selection by the multiplexer.

8. The programmable logic device of claim 7, wherein the SPI processor is further adapted to command the gating of a read clock to provide an SPI read clock to the plurality of SPI flash memories.

9. The programmable logic device of claim 8, wherein the SPI processor is further adapted to provide a read command to the plurality of SPI flash memories using a high-during-configuration (HDC) signal.

10. The programmable logic device of claim 7, further comprising:
a latch adapted to store at least a portion of the leading read address signal provided by the SPI processor.

11. A system comprising:
a plurality of serial interface memory devices, each adapted to store a configuration bitstream;
a master field programmable gate array (FPGA) coupled to the plurality of serial interface memories to receive their bitstreams, the master PLD including:
a multiplexer adapted to select the configuration bitstream from each of the plurality serial interface memories; and
a serial interface processor adapted to command the bitstream selection by the multiplexer; and
one or more slave FPGAs daisy chained to the master FPGA and adapted to receive a configuration bitstream from the master FPGA.

12. The system of claim 11, wherein the master FPGA further includes a bitstream decompressor adapted to decompress the configuration bitstream received from the serial interface memories, the master FPGA adapted to provide a decompressed configuration bitstream to the one or more slave FPGAs.

13. The system of claim 11, wherein the serial interface memories are serial peripheral interface (SPI) memories.

14. The system of claim 11, wherein the master FPGA further includes:
a latch adapted to store at least a portion of a leading read address signal provided by the serial interface processor to the plurality of serial interface memories.

15. The system of claim 14, wherein the master FPGA further includes:
a memory interface adapted to receive a first address signal from an external source and couple the first address signal to the latch such that the latch may store the first address signal as the at least a portion of the leading read address signal.

16. The system of claim 15, wherein the master FPGA further includes:
a configuration memory, wherein the latch is further adapted to store a second address signal stored by the configuration memory as the at least a portion of the leading read address signal.

17. The system of claim 15, wherein the master FPGA further includes:
an interface for receiving a size command indicating the number of serial interface memories.

18. The system of claim 17, wherein the serial interface memories are SPI flash memories and wherein the serial interface processor is an SPI interface processor.

* * * * *

UNITED STATES PATENT AND TRADEMARK OFFICE
CERTIFICATE OF CORRECTION

PATENT NO.        : 7,554,357 B2                                                         Page 1 of 1
APPLICATION NO.  : 11/346817
DATED             : June 30, 2009
INVENTOR(S)       : Zheng Jeff Chen It is certified that error appears in the above-identified patent and that said Letters Patent is hereby corrected as shown below:

Col. 8, claim 11, line 6: change "the master PLD including:" to
--the master FPGA including:--

Col. 8, claim 11, line 8: change "from each of the plurality serial interface memories; and" to
--from each of the plurality of serial interface memories; and--

Signed and Sealed this

Twentieth Day of April, 2010

David J. Kappos
*Director of the United States Patent and Trademark Office*